United States Patent [19]

Ishikawa

[11] Patent Number: 5,612,168
[45] Date of Patent: Mar. 18, 1997

[54] IMAGE TRANSFER SHEET COMPRISING AN INTERMEDIATE LAYER AND AN IMAGING LAYER WHEREIN THE POLYMER IN THE INTERMEDIATE LAYER AND THE IMAGING LAYER HAVE A COMMON MONOMER

[75] Inventor: Keiko Ishikawa, Toyota, Japan

[73] Assignee: Brother Kogyo Kabushiki Kaisha, Nagoya, Japan

[21] Appl. No.: 63,316

[22] Filed: May 19, 1993

[30] Foreign Application Priority Data

Jul. 30, 1992 [JP] Japan ................... 4-224685

[51] Int. Cl.$^6$ .................. G03C 1/93; G03C 11/12
[52] U.S. Cl. ............ 430/263; 430/138; 430/252; 430/256; 430/262; 428/402.2; 503/214; 503/215; 503/226
[58] Field of Search ................ 430/252, 138, 430/200, 211, 253, 256, 262, 263; 428/402.2; 503/214, 215, 226

[56] References Cited

U.S. PATENT DOCUMENTS

| | | | |
|---|---|---|---|
| 4,339,209 | 8/1983 | Sanders et al. | 430/138 |
| 4,440,846 | 4/1984 | Sanders et al. | 430/138 |
| 4,501,809 | 2/1985 | Hiraishi et al. | 430/138 |
| 4,551,407 | 11/1985 | Sanders et al. | 430/138 |
| 4,554,235 | 11/1985 | Adair et al. | 430/138 |
| 4,562,137 | 12/1985 | Sanders et al. | 430/138 |
| 5,019,475 | 5/1991 | Higashiyama et al. | 430/138 |
| 5,043,314 | 8/1991 | Suzuki et al. | 430/138 |
| 5,217,841 | 6/1993 | Ishikawa | 430/138 |

FOREIGN PATENT DOCUMENTS

| | | |
|---|---|---|
| 61-035283 | 2/1986 | Japan . |
| 2183354 | 6/1987 | United Kingdom . |

*Primary Examiner*—John S. Chu
*Attorney, Agent, or Firm*—Oliff & Berridge

[57] ABSTRACT

An image transfer sheet comprises a base sheet, an intermediate thermoplastic resin layer and a top developer layer containing a binder. The binder of the top layer and the thermoplastic resin of the intermediate layer include a polymer having a common monomer component so that separation of the top layer from the intermediate layer and splitting of the top layer are effectively prevented. This provides a clear, high quality image on an image receiving surface such as paper by transference of a developed image on the developer layer.

19 Claims, 5 Drawing Sheets

IMAGE TRANSFER SHEET COMPRISING AN INTERMEDIATE LAYER AND AN IMAGING LAYER WHEREIN THE POLYMER IN THE INTERMEDIATE LAYER AND THE IMAGING LAYER HAVE A COMMON MONOMER

BACKGROUND OF THE INVENTION

1. Field of the Invention

The invention relates to an image transfer sheet for transferring an image developed thereon to an image receiving surface such as a post card, ordinary paper, a plastic sheet or a cloth.

2. Description of Related Art

It is known to record an image using a combination of photo-sensitive and pressure-sensitive recording medium which includes a base sheet and, supported thereon, a layer of microcapsules each filled with an inside phase containing a photo-curable substance, a photo-initiator and a dye precursor as main ingredients thereof, and a developer sheet which includes a substrate and a developer layer supported thereon. The developer colors by the reaction with the dye precursor.

Recording medium capable of recording an image by hardening of microcapsules is well known. Also known is a recording medium in which microcapsules and a developer are supported on a common substrate. See for example, U.S. Pat. Nos. 4,501,809, 4,399,209 and 4,440,846.

In such a recording medium, the record of an image is effected by utilizing the phenomenon that the micro-capsules are changed into rigid particles by the hardening of the internal photo-curable substance by irradiation with light.

Such a recording medium may be used in an recording system in which the recording medium is subjected to image-wise exposure, followed by rupture of non-exposed microcapsules to form a copy image by reaction of the encapsulated dye precursor with the developer.

With the above-mentioned photo-sensitive and pressure-sensitive recording medium, an image can be formed only on the specifically processed recording medium per se or the developer sheet; i.e., it is impossible to form images on an ordinary paper such as a post card, a plastic film, a cloth or other desired surfaces.

A system in which an image transfer, developer sheet having a base sheet provided thereon with an intermediate, thermoplastic resin layer and a top, developer layer is used for forming an image on an image forming surface such as ordinary paper is disclosed in U.S. Pat. No. 5,019,475.

With this system, the image transfer, developer sheet is placed with its developer layer in face to face contact with an image-exposed microcapsule layer of a photo-sensitive and pressure-sensitive recording medium to form an image on the developer sheet. Thereafter, the image-carrying developer sheet is brought into contact with an image receiving surface such as ordinary paper with heating. By peeling away the base sheet, a transferred image is formed on the image receiving surface.

The known image transfer, developer sheet, however, has been found to involve the problem that a clear image is not always obtainable on the image receiving surface because the developer layer tends to be torn or peeled off from the thermoplastic resin layer during use. Thus, when the transfer sheet is warped such as during transference of the developed image from the transfer sheet to an image-receiving surface, the transfer layer occasionally splits or falls off.

Further, the transfer layer is apt to be peeled off from the thermoplastic resin layer during the severing of a master roll thereof with a cutter or during handling.

It has now been found that the above problem is attributed to poor affinity or compatibility between the developer layer and the thermoplastic resin layer and to poor flexibility of the developer layer. Therefore, the developer layer tends to be cracked or to split upon receipt of an external force.

SUMMARY OF THE INVENTION

It is, therefore, an object of the present invention to provide an image transfer sheet which can prevent the splitting of the developer layer during the transference of the developed image, which can minimize undesirable separation of the developer layer from the thermoplastic resin layer and which can give a clear, high quality image on an image receiving surface such as ordinary paper, a plastic film or a cloth.

In order to achieve the above and other objects, the image transfer sheet comprises a base sheet; an image forming layer formed on said base sheet for receiving an image which is to be transferred onto an image receiving material, said image forming layer including a binding material; and a thermoplastic resin layer formed on said image forming layer, including thermoplastic resin, wherein the binding material and the thermoplastic resin include a polymer having a common monomer component thereby the image formed on said image forming layer is transferred onto the image receiving material with said thermoplastic resin layer by applying heat thereto.

With the above-described structure, the image forming layer has improved flexibility, and the adhesion force between the image forming layer and the thermoplastic resin layer is improved since the binder of the image forming layer and the thermoplastic resin include a polymer having a common monomer component. By these expedients, splitting of the developer layer and separation of the developer layer from the thermoplastic resin layer can be prevented.

BRIEF DESCRIPTION OF THE DRAWINGS

Other objects, features and advantages of the present invention will become apparent from the detailed description of the preferred embodiments of the invention which follows, when considered in light of the accompanying drawings, in which.

DETAILED DESCRIPTION OF PREFERRED EMBODIMENTS

Formation of an image on an image receiving member 5, such as ordinary paper, a plastic film or a cloth, using an image transfer, developer sheet 1 and a photo-sensitive and pressure-sensitive recording medium 6 will now be described with reference to FIGS. 1–4.

Figure 1:
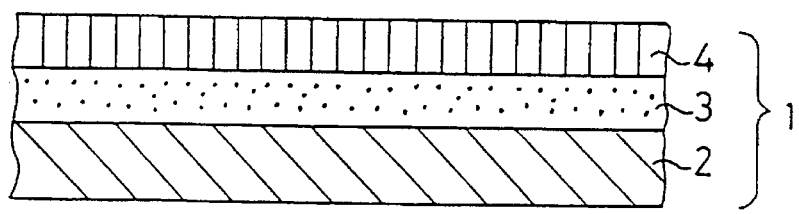
FIG. 1 is a sectional side view schematically showing an image transfer-type developer sheet according to the present invention.

The image transfer, developer sheet 1 has a three-layer structure, as shown in FIG. 1, in which a top developer layer 4 is provided on a base sheet 2 sandwiching a thermoplastic resin layer 3 as an intermediate layer therebetween.

Figure 2:
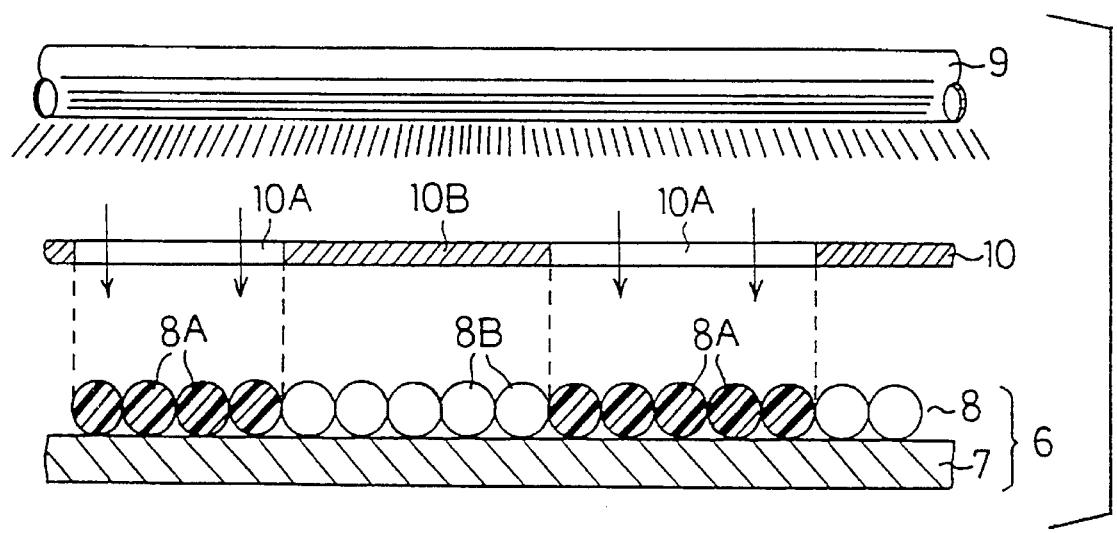
FIG. 2 is a sectional side view schematically showing exposure of a photo-sensitive and pressure-sensitive recording medium for the formation of a latent image.

As shown in FIG. 2, the recording medium 6 comprises a substrate 7 and a layer 8 of microcapsules supported on the substrate 7. When the recording medium 6 is irradiated with light from a light source 9 through an original 10, those portions 8B of the microcapsule layer 8 corresponding to image portions 10B of the original 10 remain unexposed, while those portions 8A of the microcapsule layer 8 corresponding to opaque portions 10A of the original are exposed. As a result of the exposure, the microcapsules of the exposed portions 8A are hardened with the unexposed portions 8B remaining unhardened.

Figure 3:
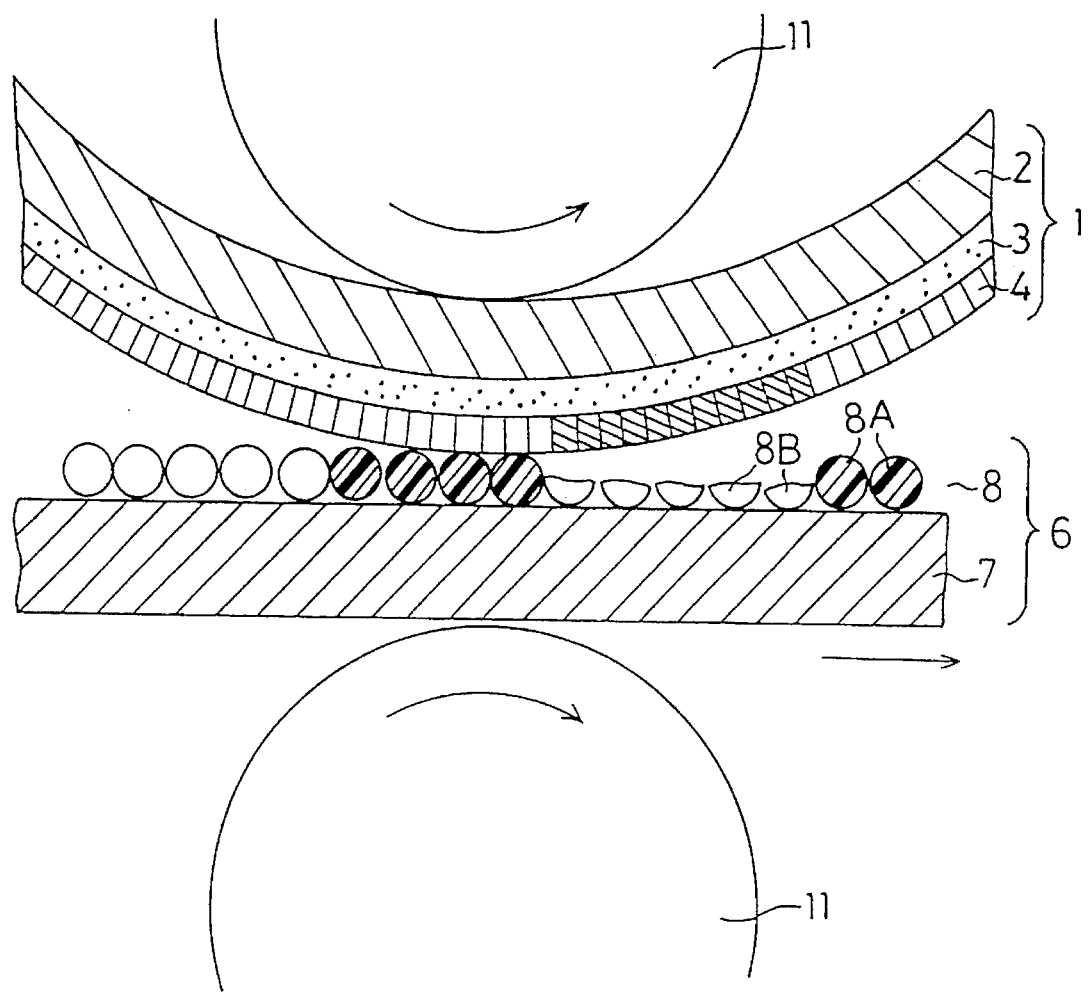
FIG. 3 is a sectional side view schematically showing the formation of a developed image on the image transfer-type developer sheet.

Next, as shown in FIG. 3, the thus exposed recording medium 6 is placed with the microcapsule layer 8 thereof being in face to face contact with the developer layer 4 of the developer sheet 1 while applying pressure from both sides using a pair of pressure rollers 11.

As a consequence, the microcapsules in the unexposed areas 8B are ruptured so that a dye precursor confined therewithin is transferred to the developer layer 4 of the developer sheet 1, whereupon the dye precursor reacts with the developer to form a developed image which corresponds to the image of the original 10 on the developer layer 4.

Figure 4:
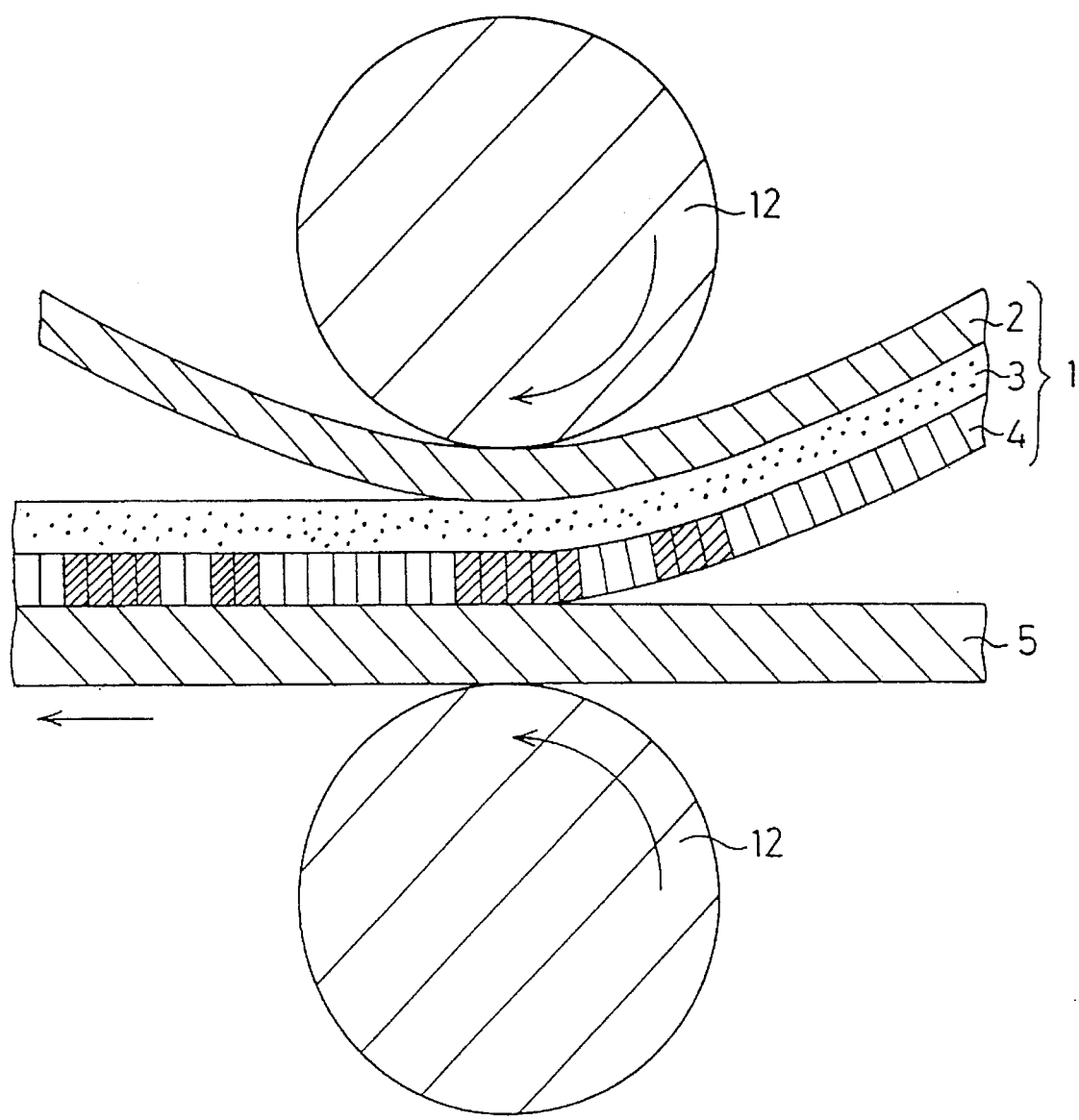
FIG. 4 is a sectional side view schematically showing transference of the developed image to an image receiving surface.

Thereafter, as shown in FIG. 4, the developer sheet 1 is superposed on the image receiving member 5 such that the image bearing developer layer 4 of the developer sheet 1 is in contact with the image receiving surface of the member 5, while applying heat and pressure from both sides thereof by means of heated pressure rollers 12. As a result, the binder in the image bearing developer layer 4 is fused to cause the image bearing developer layer 4 to adhere to the image receiving member 5. By removing the base sheet 2 of the developer sheet 1, a copy image is obtained on the image receiving member 5. In place of the pressure rollers 12, heat plates or an iron can be of course used, if desired.

The image transference between the developer sheet 1 and the image receiving member 5 is preferably performed at about 80° C.–150° C. The thermoplastic resin layer 3 is generally colorless and transparent, while the developer layer 4 is generally white before being fused. Depending upon the materials used, the developer layer 4 turns colorless or remains white when heated and fused.

The construction and the fabrication of the photo-sensitive and pressure-sensitive recording medium 6 will now be described.

As described previously, the recording medium 6 comprises a sheet-like substrate 7 and a layer 8 of microcapsules each having an inside phase containing a photocurable resin, a photopolymerization initiator and a dye precursor as main ingredients.

Typical examples of the photocurable resin include ethylene glycol diacrylate, ethylene glycol dimethacrylate, trimethylolpropane triacrylate and diethylene glycol dimethacrylate. As the polymerization initiator, there may be used, for example, an α-alkoxyphenyl ketone, a poly-nuclear quinone, a substituted benzophenone, a xanthone or a thioxanthone. The dye precursor may be a compound having a lactone, lactum or spiropyrane structure, such as a triarylmethane compound or bisphenylmethane compound. Illustrative of suitable dye precursor are crystal violet lactone and benzoyl leuco methylene blue. Encapsulation of these ingredients may be carried out in any suitable known method such as a corcervation method or an interfacial polymerization method.

Next, the construction and the fabrication of the image transfer, developer sheet 1 will be described.

As described previously, the developer sheet 1 has a three-layer structure in which the developer layer 4 is provided on the base sheet 2 with the thermoplastic resin layer 3 being interposed therebetween.

It is preferred that the base sheet 2 has a smooth surface and exhibit good mold releasing properties. A resin film is used as the base sheet 2. Examples of resin film which can be suitably used are a polyester film such as a polybutylene terephthalate film, a polyolefin film such as a polyethylene film and a polypropylene film, a poly(vinyl chloride) film, a polycarbonate film, a polystyrene film or a polyamide film. The base sheet 2 generally has a thickness of about 25 μm–200 μm, preferably 50 μm–100 μm.

It is not necessary that the base sheet 2 be a colorless transparent film. However, it is preferred that the base sheet 2 permits easy positioning or register thereof relative to the image receiving member 5.

Any developer may be used for the formation of the developer layer 4, as long as it can color by the reaction with the dye precursor contained in the above-mentioned microcapsules. Developers conventionally employed in pressure-sensitive sheets may be suitably used. Illustrative of preferable developers are inorganic acidic substances such as acid clay and kaolin, phenol compounds such as p-phenylphenol, and aromatic carboxylic acids such as salicylic acid, propyltannic acid and gallic acid. These developers may be used singly or in combination of two or more.

A binder is incorporated into the developer layer 4 for supporting the developer at an arbitrary ratio. For example, the ratio of the developer and the binder is 100:1–1:1, more preferably 50:1–2:1. The resins of the thermoplastic resin layer 3 and the binder have a common monomer. The resins and the binder are able to be softened or melted by heating and solidified by cooling. It is preferred that the resins and the binder have a softening or melting point of not lower than about 60° C. but not higher than about 100° C.

Examples of binders include vinyl resins such as ethylenevinyl acetate copolymers, poly(vinyl chloride) and vinyl chloridevinyl acetate copolymers; acryl resins such as poly-(ethyl acrylate), poly(butyl acrylate), poly(methyl cyanoacrylate) and ethylene-acrylic acid copolymers; styrene resins, polyester resins, polyamide resins and polyolefin resins. These thermoplastic resins may be used singly or in combination of two or more thereof.

Provided between the base sheet 1 and the developer layer 4 is the thermoplastic resin layer 3. The thermoplastic resin used in the layer 3 should be similar to that used as the binder in the developer layer 4. Preferably, the resins used in the layers 3 and 4 have a common monomer. For example, when polyethylene is used as the thermoplastic resin of the layer 3, the binder to be used in the layer 4 may be, for example, a copolymer or homopolymer containing ethylene monomer units or a mixture containing such an ethylene-containing polymer.

Figure 5:
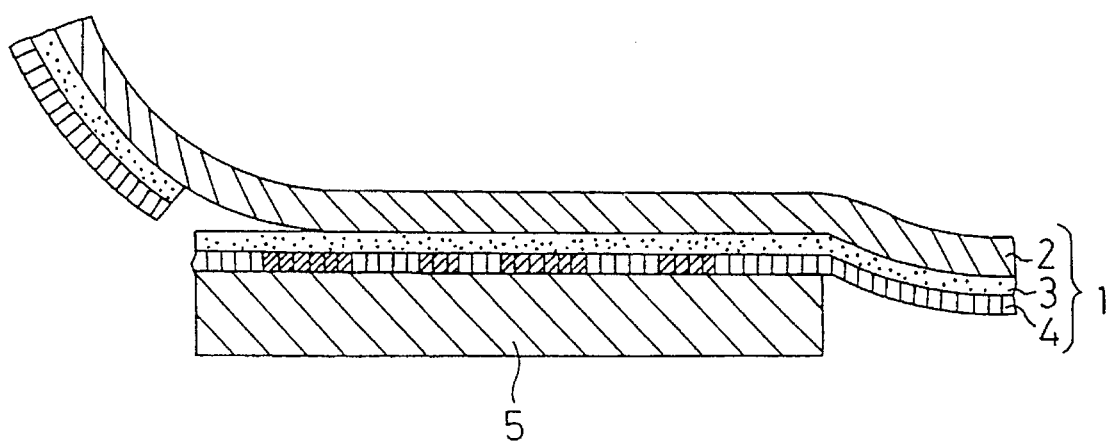
FIG. 5 is a sectional side view schematically showing the peeling away operation of the base sheet.

As shown in FIG. 5, after an image bearing surface of the developer layer 4 has been pressure contacted with the image receiving member 5, the developer layer 4 and the thermoplastic resin layer 3 are cut at the edge portion of the image receiving member 5.

In this case, prior to the cutting, the following relationships are established such that the layers 3 and 4 can be cut without causing separation of respective layers 3 and 4:

(1) The adhesion force between the base sheet 2 and the thermoplastic resin layer 3 is greater than the shearing force of the thermoplastic resin layer 3 and the developer layer 4.

(2) The adhesion force between the thermoplastic resin layer 3 and the developer layer 4 is greater than the shearing force of the thermoplastic resin layer 3 and the developer layer 4.

If the condition (1) is not established, then the base sheet 2 will be separated from the thermoplastic resin layer 3 when the developer layer 4 and the thermoplastic resin layer 3 are cut. On the other hand, if the condition (2) is not established, then the developer layer 4 will be separated from the thermoplastic layer 3 when these layers 3 and 4 are cut.

After the layers 3 and 4 have been cut as shown in FIG. 5, the base sheet 2 is peeled away to leave the transfer layer 4 on the image-receiving surface 5. In this case, the following relationships are established:

(3) The adhesion force between the developer layer 4 and the image receiving surface 5 is greater than the adhesion force between the base sheet 2 and the thermoplastic resin layer 3.

(4) The adhesion force between the thermoplastic layer 3 and the developer layer 4 is greater than the adhesion force between the base sheet 2 and the thermoplastic resin layer 3.

Because the binder of the developer layer 4 is similar to the thermoplastic resin of the layer 3, the above relationships (1)–(4) can be established.

The following example will further illustrate the above embodiment.

In this example, a 75 μm thick polyethylene terephthalate film was used as the base sheet 2 of the developer sheet 1. The thermoplastic resin layer 3 and the binder used were made of a mixture of a styrene/acrylic acid copolymer resin and a polyester resin.

80 parts by weight of a 50% by weight emulsion (viscosity: 1,000 cps) of a styrene-acrylic acid copolymer and 20 parts by weight of a 26% by weight aqueous solution of a polyester (viscosity: 20 cps) were mixed with each other. The mixture was applied onto a 75 μm thick polyethylene terephthalate base sheet 2 and dried at 110° C. for 1 minute to form a thermoplastic resin layer 3 having a thickness of 10 μm. 50 Parts by weight of acid clay, 30 parts by weight of bisphenol A and 30 parts by weight of p-phenylphenol were dispersed in a binder liquid consisting of 60 parts by weight of a 30 % by weight emulsion of a styrene-acrylic acid copolymer and 10 parts by weight of a 26 % by weight solution of a polyester to obtain a developer-containing dispersion. This was then applied onto the surface of the above thermoplastic resin layer 3 and the coating was dried in a recirculated hot air hot oven at 80° C. for 1 minute to form a developer layer 4 having a thickness of 15 μm, thereby producing an image transfer-type developer sheet 1 having a three layer structure.

A mixture containing 100 parts by weight of a photocurable resin, 3 parts by weight of a dye precursor, 2.5–4 parts by weight of a photo-polymerization initiator, a photo-sensitizer (less than 10 % by weight of the photoinitiator) and, optionally, a binder and/or a plasticizer (each less than 1% by weight) was encapsulated by corcervation. The resulting microcapsules were dispersed in a 5% by weight aqueous polyvinyl alcohol solution and the dispersion was applied onto a polyester film having a thickness of 25 μm, thereby to obtain a photo-sensitive and pressure-sensitive recording medium 6.

A latent image was then formed on this recording medium 6 by image-wise exposure thereof. The latent image-bearing surface of the recording medium 6 was contacted with the developer layer 4 of the above developer sheet 1 while applying heat and pressure to obtain a developed image on the developer sheet 1. An ordinary paper was then superposed on the developed image-bearing surface of the developer sheet 4 and this was fed between heated pressure rollers at 130° C. at a rate of 10 mm/second so that the developed image was transferred to the paper.

In this example, the resin used as the thermoplastic resin layer 3 and the binder of the developer layer 4 is styrene-acrylic acid copolymer resin. However, the two copolymer resins differed from each other in "Minimum Film forming Temperature". The term "Minimum Film forming Temperature" (hereinafter referred to as MFT) is intended to refer to the lowest temperature above which the resin particles are melt-adhered to each other to form a film.

The copolymer resin used in the thermoplastic resin layer 3 was composed of a mixture of a first emulsion having MFT of 0° C. and a second emulsion having MFT of 20° C. with a mixing ratio of the first to second being 9:1, while the copolymer resin used in the developer layer 4 as the binder was composed of a mixture of a third emulsion having MFT of 95° C. and a fourth emulsion having MFT of 9° C. with a mixing ratio of the third to fourth being 1:1.

Since MFT of the copolymer of the binder is 95° C. and it is higher than 80° C. which is the drying temperature of the developer layer 4, the developer in the developer layer 4 was not surrounded by or blocked with a film of the binder resin. Therefore, when the developer reacts with the dye precursor by the ruptures of the unexposed microcapsules 8B as shown in FIG. 3, there is no problem that the developer cannot react with the precursor because of the film of the resin of the binder covering the developer. As a result, the development of the latent image proceeded efficiently.

Further, the use of the polyester resin served to improve the flexibility of the developer layer 4 so that there involved no problem of splitting of the developer layer even when the layer 4 was warped. Since MFT of the styrene-acrylic acid copolymer of the binder of the developer layer which is 95° C. was lower than the temperature (roll temperature: 130° C.) at which the transference of the developed image to the paper was performed, the developer layer 4 was able to be tightly adhered to the paper.

Further, since the binder of the developer layer 4 and the thermoplastic layer 3 has a common styrene-acrylic acid copolymer, the developer layer 4 had good affinity with the thermoplastic resin layer 3 and the separation of these layers 3 and 4 from each other was prevented.

In addition, since the MFT of the copolymer in the thermoplastic resin layer 3, which is 20° C., was lower than the temperature at which the drying of the developer layer was performed, which is 80° C., the adhesive force of the thermoplastic resin layer 3 with the developer layer 4 and the base sheet 2 becomes excellent.

It is thus preferred that MFT of the thermoplastic resin of the thermoplastic resin layer 3 be lower than the temperature at which the drying of the developer layer 4 is performed and that MFT of the binder resin of the developer layer 4 be higher than the drying temperature but lower than the temperature at which the image transference is performed.

The present invention may be embodied in other specific forms without departing from the scope of the invention encompassed by the appended claims.

Figure 6:
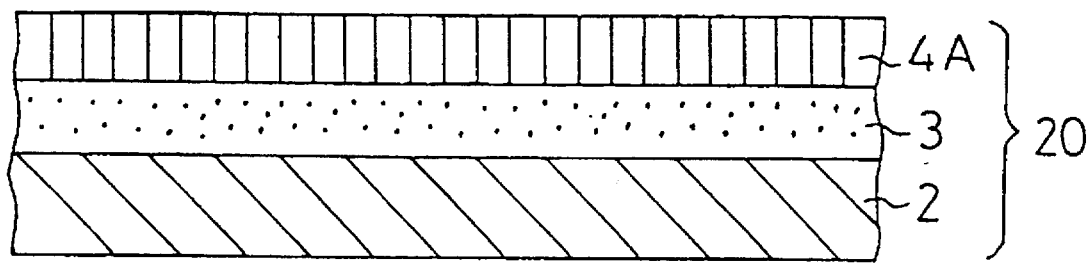
FIG. 6 is a sectional side view schematically showing another embodiment of image transfer sheet according to the present invention.

For example, the dye precursor contained in the microcapsules can be replaced by a colored dye or pigment. FIG. 6 depicts another embodiment of image transfer sheet 20 according to the present invention which is used in combination with such a photo-sensitive and pressure-sensitive recording medium.

The second embodiment is explained with reference to FIG. 6. The same construction and operation as the above first embodiment is omitted. Differences from the first embodiment are that the image transfer sheet of the second embodiment has an absorption layer instead of the developer layer 4 and uses dye or pigment instead of dye precursor.

The image transfer sheet 20 of the second embodiment has a three layer structure including a base sheet 2, an intermediate, thermoplastic resin layer 3, and a top, image absorption layer 4A. The absorption layer 4A comprises a filler and a binder. The binder is the same as that used in the first embodiment. The filler serves only to facilitate the absorption of the colored image of the recording medium which has been developed by the rupture of unexposed microcapsules. Therefore, the filler has no relation to coloring.

Both particles of organic and inorganic compounds can be used as the fillers for the purpose of the present invention. Examples of inorganic compound fillers include particles of a metal, a metal oxide, a metal nitride or a metal carbide, while examples of organic compound fillers include polymers such as an acryl resin, a polyolefin resin, a polyvinyl acetate resin, a polyvinyl chloride resin, a styrene resin, a polyamide resin, a polyester resin, a silicone resin, a fluorocarbon resin, a petroleum resin and rubber, and rosin or wax. These fillers may be used singly or in combination of two or more. The average particle diameter of the filler is generally about 0.1 µm or more, preferably 0.5 µm–20 µm.

As the dye or pigment to be confined within the microcapsules, any known or commercially available pigment or dye may be used. For example, those disclosed in the "Dye Handbook" edited by Japan Organic Synthesis Chemical Association (1970) and in the "Latest Pigment Handbook" edited by Japan Pigment Technique Association (1977) may be suitably used. The dye and pigment is generally used in the form of a dispersion or a solution.

In using the image transfer sheet 20 shown in FIG. 6 and dye or pigment confined within the microcapsules 8, the same effects as in the first embodiment can be obtained.

While advantageous embodiments have been chosen to illustrate the invention, it will be understood by those skilled in the art that various changes and modifications can be made therein without departing from the scope of the invention as defined in the appended claims.

What is claimed is:

1. An image transfer sheet for transferring an image developed thereon to an image receiving surface, comprising:
   a base sheet;
   an intermediate layer removably coupled to said base sheet, said intermediate layer including a polymer; and
   a top imaging layer coupled to said intermediate layer, said top imaging layer including image forming material and a binder having a polymer,
   wherein said polymer in said intermediate layer and said polymer in said binder have a common monomer.

2. The image transfer sheet of claim 1, wherein said polymer of said binder and said intermediate layer are a resin.

3. The image transfer sheet of claim 1, wherein said top imaging layer is a developer layer for reacting with a dye precursor.

4. The image transfer sheet of claim 1, wherein said top imaging layer is an image absorptive layer including a filler material for absorbing dye.

5. The image transfer sheet of claim 1, wherein said intermediate layer is made of a thermoplastic resin.

6. The image transfer sheet of claim 1, wherein said base sheet is made of a polyester resin.

7. The image transfer sheet of claim 1, wherein said intermediate layer has a minimum film forming temperature lower than a temperature at which said top imaging layer is dried during formation.

8. The image transfer sheet of claim 1, wherein an adhesion force between said base sheet and said intermediate layer and an adhesion force between said intermediate layer and said top imaging layer is greater than a shearing force between said intermediate layer and said top imaging layer.

9. The image transfer sheet of claim 1, wherein an adhesion force between said top imaging layer and an image receiving surface and an adhesion force between said intermediate layer and said top imaging layer is greater than an adhesion force between base sheet and said intermediate layer.

10. The image transfer sheet of claim 1, wherein said polymer of said binder and said intermediate layer has a softening point in the range of about 60°–100° C.

11. The image transfer sheet of claim 1, wherein said polymer of said binder is selected from the group of materials consisting of vinyl resins, acryl resins, styrene resins, polyester resins, polyamide resins and polyolefin resins.

12. The image transfer sheet of claim 1, wherein said polymer of said intermediate layer is selected from the group of materials consisting of vinyl resins, acryl resins, styrene resins, polyester resins, polyamide resins and polyolefin resins.

13. An image transfer sheet for transferring an image developed thereon to an image receiving surface, comprising:
   a base sheet;
   an intermediate layer coupled to said base sheet, said intermediate layer including a polymer;
   a top imaging layer coupled to said intermediate layer, said top imaging layer including image forming material and a binder having a polymer;
   wherein said polymer in said intermediate layer and said polymer in said binder have a common monomer and wherein a first adhesion force between the intermediate layer and the top imaging layer is greater than a second adhesion force between the intermediate layer and the base sheet.

14. The image transfer sheet of claim 13, wherein the second adhesion force is sufficiently lower than the first adhesion force to permit separation of the intermediate layer and the base sheet without separation of the top imaging layer and the intermediate layer.

15. An image transfer sheet for transferring an image developed thereon to an image receiving surface, comprising:
   a base sheet;
   an intermediate layer removably coupled to said base sheet, said intermediate layer including a polymer; and
   a top imaging layer coupled to said intermediate layer, said top imaging layer including image forming material and a binder having a polymer, said polymer in said intermediate layer and said polymer in said binder having a common monomer, wherein said top imaging layer has a minimum film forming temperature lower than a temperature that the image is transferred to the image receiving surface.

16. An image transfer sheet for transferring image developed thereon to an image receiving surface comprising:

a base sheet;

an intermediate layer removably coupled to said base sheet, said intermediate layer including a polymer;

a top-imaging layer coupled to said intermediate layer, said top-imaging layer including image forming material and a binder having a polymer;

wherein said polymer in said intermediate layer and said polymer in said binder have a common monomer selected from the group consisting of a styrene monomer, a polybasic acid monomer, a polyol monomer, an amine monomer, vinyl acetate, vinyl chloride, ethyl acrylate, butyl acrylate, methyl cyanoacrylate, acrylic acid and ethylene.

17. The image transfer sheet of claim 16, wherein said top imaging layer is a developer layer for reacting with a dye precursor.

18. The image transfer sheet of claim 16, wherein said top imaging layer is an image absorptive layer including a filler material for absorbing dye.

19. The image transfer sheet of claim 16, wherein an adhesion force between said top imaging layer and an image receiving surface and an adhesion force between said intermediate layer and said top imaging layer is greater than an adhesion force between said base sheet and said intermediate layer.

* * * * *